United States Patent
Yanagihara et al.

(10) Patent No.: US 10,411,714 B2
(45) Date of Patent: Sep. 10, 2019

(54) VARIABLE FREQUENCY DIVIDER

(71) Applicant: Mitsubishi Electric Corporation, Tokyo (JP)

(72) Inventors: Yuki Yanagihara, Tokyo (JP); Koji Tsutsumi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/071,978

(22) PCT Filed: Mar. 16, 2016

(86) PCT No.: PCT/JP2016/058335
§ 371 (c)(1),
(2) Date: Jul. 23, 2018

(87) PCT Pub. No.: WO2017/158761
PCT Pub. Date: Sep. 21, 2017

(65) Prior Publication Data
US 2019/0036533 A1    Jan. 31, 2019

(51) Int. Cl.
*H03B 19/00* (2006.01)
*H03L 7/00* (2006.01)
(Continued)

(52) U.S. Cl.
CPC .......... *H03K 21/08* (2013.01); *H03K 23/64* (2013.01); *H03K 23/667* (2013.01); *H03L 7/18* (2013.01); *H03L 7/193* (2013.01)

(58) Field of Classification Search
CPC .................................. H03K 21/08; H03L 7/18
See application file for complete search history.

(56) References Cited

U.S. PATENT DOCUMENTS 7,564,276 B2 *   7/2009  Narathong ............. H03K 23/54
                                                     327/115
8,552,770 B2 *  10/2013  Cavin ....................... G06F 1/08
                                                     327/115
(Continued)

FOREIGN PATENT DOCUMENTS

JP          2015-228569 A         12/2015

OTHER PUBLICATIONS

Vaucher et al., "A Family of Low-Power Truly Modular Programmable Dividers in Standard 0.35- m CMOS Technology", IEEE Journal of Solid-State Circuits, vol. 35, No. 7, Jul. 2000, pp. 1039-1045.

(Continued)

*Primary Examiner* — Kenneth B Wells
(74) *Attorney, Agent, or Firm* — Birch, Stewart, Kolasch & Birch LLP

(57) ABSTRACT

A setting data output circuit (3) is configured to update setting data in synchronization with a frequency divided signal output from a dual modulus frequency divider on a last stage out of the dual modulus frequency dividers to which a non-significant reset signal is output from a reset circuit (6) which are included in a plurality of dual modulus frequency dividers (1-1 and 1-2) in a first frequency divider group (1). As a result, when a frequency dividing ratio of the dual modulus frequency divider on the last stage out of valid dual modulus frequency dividers contributing to frequency dividing operation is 3, it is possible to realize normal frequency dividing operation even in a case in which frequency dividing ratio setting data to decrease the number of valid dual modulus frequency dividers contributing to the frequency dividing operation is provided.

5 Claims, 5 Drawing Sheets

(51) Int. Cl.
*H03K 21/00* (2006.01)
*H03K 23/00* (2006.01)
*H03K 21/08* (2006.01)
*H03K 23/64* (2006.01)
*H03L 7/18* (2006.01)
*H03K 23/66* (2006.01)
*H03L 7/193* (2006.01)

(56) References Cited

U.S. PATENT DOCUMENTS

| | | | |
|---|---|---|---|
| 8,565,368 B1 | 10/2013 | Chen et al. | |
| 9,018,988 B2* | 4/2015 | Abdel-Haleem | H03L 7/193 327/115 |
| 9,118,333 B1* | 8/2015 | Mika | H03K 23/70 |
| 9,900,012 B2* | 2/2018 | Cali | H03K 21/026 |

OTHER PUBLICATIONS

Extented European Search Report issued in corresponding European Patent Application No. 16894379.3.

* cited by examiner

VARIABLE FREQUENCY DIVIDER

TECHNICAL FIELD

The present invention relates to a variable frequency divider capable of making a frequency dividing ratio variable.

BACKGROUND ART

In some cases, a variable frequency divider capable of making a frequency dividing ratio variable is used as a part of a phase locked loop (PLL), for example.

That is, a variable frequency divider may be used to frequency-divide an output signal of a voltage controlled oscillator (VCO) in the PLL with a set frequency dividing ratio.

As a configuration of a variable frequency divider, a configuration in which a plurality of dual modulus frequency dividers is connected in series is known.

Further, as the dual modulus frequency divider, for example, a frequency divider which performs an operation as described below is known.

When the dual modulus frequency divider receives a mod signal which is a control signal from the dual modulus frequency divider on a subsequent stage, in a case in which the mod signal indicates that the frequency dividing ratio is to be fixed, the dual modulus frequency divider frequency-divides a clock signal output from the dual modulus frequency divider on a preceding stage by 2 and outputs the frequency divided signal of the clock signal to the dual modulus frequency divider on the subsequent stage.

In a case in which the mod signal indicates that the frequency dividing ratio is allowed to be variable, the dual modulus frequency divider performs the following operation. When the externally provided frequency dividing ratio setting data is a signal of L level, the dual modulus frequency divider frequency-divides the clock signal output from the dual modulus frequency divider on the preceding stage by 2 and outputs the frequency divided signal of the clock signal to the dual modulus frequency divider on the subsequent stage. When the frequency dividing ratio setting data is a signal of H level, the dual modulus frequency divider frequency-divides the clock signal output from the dual modulus frequency divider on the preceding stage by 3 and outputs the frequency divided signal of the clock signal to the dual modulus frequency divider on the subsequent stage.

Note that, a dual modulus frequency divider outputs a mod signal output from the dual modulus frequency divider on the subsequent stage to the dual modulus frequency divider on the preceding stage.

In a case of the variable frequency divider in which n dual modulus frequency dividers each of which has the configuration as described above are connected in series, by updating the frequency dividing ratio setting data provided to the n dual modulus frequency dividers, it is possible to operate the variable frequency divider with a frequency dividing ratio within a range of $2^n$ to $2^{n+1}-1$.

Further, in a variable frequency divider in which the n dual modulus frequency dividers are connected in series, it is assumed that the first stage to the m-th stage dual modulus frequency dividers form a former dual modulus frequency divider, and the (m+1)-th stage to the n-th stage, being the last stage, dual modulus frequency dividers form a latter dual modulus frequency divider. In such a variable frequency divider, it is possible to invalidate last some dual modulus frequency dividers included in the latter dual modulus frequency divider.

In a case in which the last some dual modulus frequency dividers are invalidated, the last some dual modulus frequency dividers do not contribute to the frequency dividing operation of the variable frequency divider. Consequently, the number of dual modulus frequency dividers contributing to the frequency dividing operation of the variable frequency divider decreases. As a result, it becomes possible to support a smaller frequency dividing ratio than that in a case in which all the dual modulus frequency dividers contribute to the frequency dividing operation.

For example, in the PLL, it is sometimes necessary to realize the frequency dividing ratio of a decimal number. In such a case, since the $\Delta\Sigma$ modulation is applied to the frequency dividing ratio, the variable frequency divider should operate following a dynamically changing frequency dividing ratio pattern.

In the variable frequency divider disclosed in following Patent Literature 1, in order to make it possible to operate following the dynamically changing frequency dividing ratio pattern, the internal states of invalidated dual modulus frequency dividers are initialized such that the operation when the invalidated dual modulus frequency dividers are validated next time is constant.

CITATION LIST

Patent Literature

Patent Literature 1: JP 2015-228569 A

SUMMARY OF INVENTION

Technical Problem

Since a conventional variable frequency divider is configured as described above, when the frequency dividing ratio of the dual modulus frequency divider on the last stage among valid dual modulus frequency dividers contributing to the frequency dividing operation is 3, there is a problem that normal frequency dividing operation may not be performed in a case in which a frequency dividing ratio setting data for decreasing the number of valid dual modulus frequency dividers contributing to the frequency dividing operation is provided.

For example, when the number of valid dual modulus frequency dividers contributing to the frequency dividing operation is four, and the four dual modulus frequency dividers perform frequency-dividing by 12, in a case in which the frequency dividing ratio setting data to decrease the number of valid dual modulus frequency dividers contributing to the frequency dividing operation to three and make the frequency dividing ratio to 7 is provided, erroneous operation in which the frequency dividing ratio becomes 8 may occur.

Such an erroneous operation occurs due to the following reason: the timing at which the frequency dividing ratio is updated on the basis of externally provided frequency dividing ratio setting data is the timing at which the mod signal output from the dual modulus frequency divider on a first stage falls, so that the internal state of the valid dual modulus frequency divider contributing to the frequency dividing operation differs depending on the frequency dividing ratio at the updating timing of the frequency dividing ratio.

The present invention has been made to solve the above-described problem, and an object of the invention is to obtain a variable frequency divider capable of realizing normal frequency dividing operation even in a case in which the frequency dividing ratio setting data for decreasing the number of valid dual modulus frequency dividers contributing to the frequency dividing operation is provided when the frequency dividing ratio of the dual modulus frequency divider on the last stage out of the valid dual modulus frequency dividers contributing to the frequency dividing operation is 3.

Solution to Problem

A variable frequency divider according to the present invention includes: a first frequency divider group in which a plurality of dual modulus frequency dividers is connected in series, each of the dual modulus frequency dividers being such that an internal state is initialized in a state in which a significant reset signal is provided, and a frequency dividing ratio is set to a first frequency dividing ratio or a second frequency dividing ratio in accordance with setting data and an input signal is frequency-divided with the set frequency dividing ratio to be a frequency divided signal and the frequency divided signal of the input signal is output in a state in which a non-significant reset signal is provided; a setting data output circuit outputting the setting data to the plurality of dual modulus frequency dividers in the first frequency divider group; and a reset circuit generating the significant reset signal or the non-significant reset signal in accordance with the setting data output from the setting data output circuit and outputting the significant reset signal or the non-significant reset signal to the plurality of dual modulus frequency dividers. The setting data output circuit updates the setting data in synchronization with the frequency divided signal output from a dual modulus frequency divider on a last stage out of the dual modulus frequency dividers to which the non-significant reset signal is output from the reset circuit and which are included in the plurality of dual modulus frequency dividers in the first frequency divider group.

Advantageous Effects of Invention

According to the present invention, the setting data output circuit is configured to update setting data in synchronization with a frequency divided signal output from the dual modulus frequency divider on a last stage out of the dual modulus frequency dividers to which a non-significant reset signal is output from the reset circuit and which are included in a plurality of dual modulus frequency dividers in the first frequency divider group. Therefore, when a frequency dividing ratio of the dual modulus frequency divider of the last stage out of the valid dual modulus frequency dividers contributing to the frequency dividing operation is 3, even in a case in which frequency dividing ratio setting data to decrease the number of the valid dual modulus frequency dividers contributing to the frequency dividing operation is provided, it is possible to realize normal frequency dividing operation.

DESCRIPTION OF EMBODIMENTS

Some embodiments for carrying out the present invention is hereinafter described with reference to the accompanying drawings in order to describe the present invention in more detail.

First Embodiment

Figure 1:
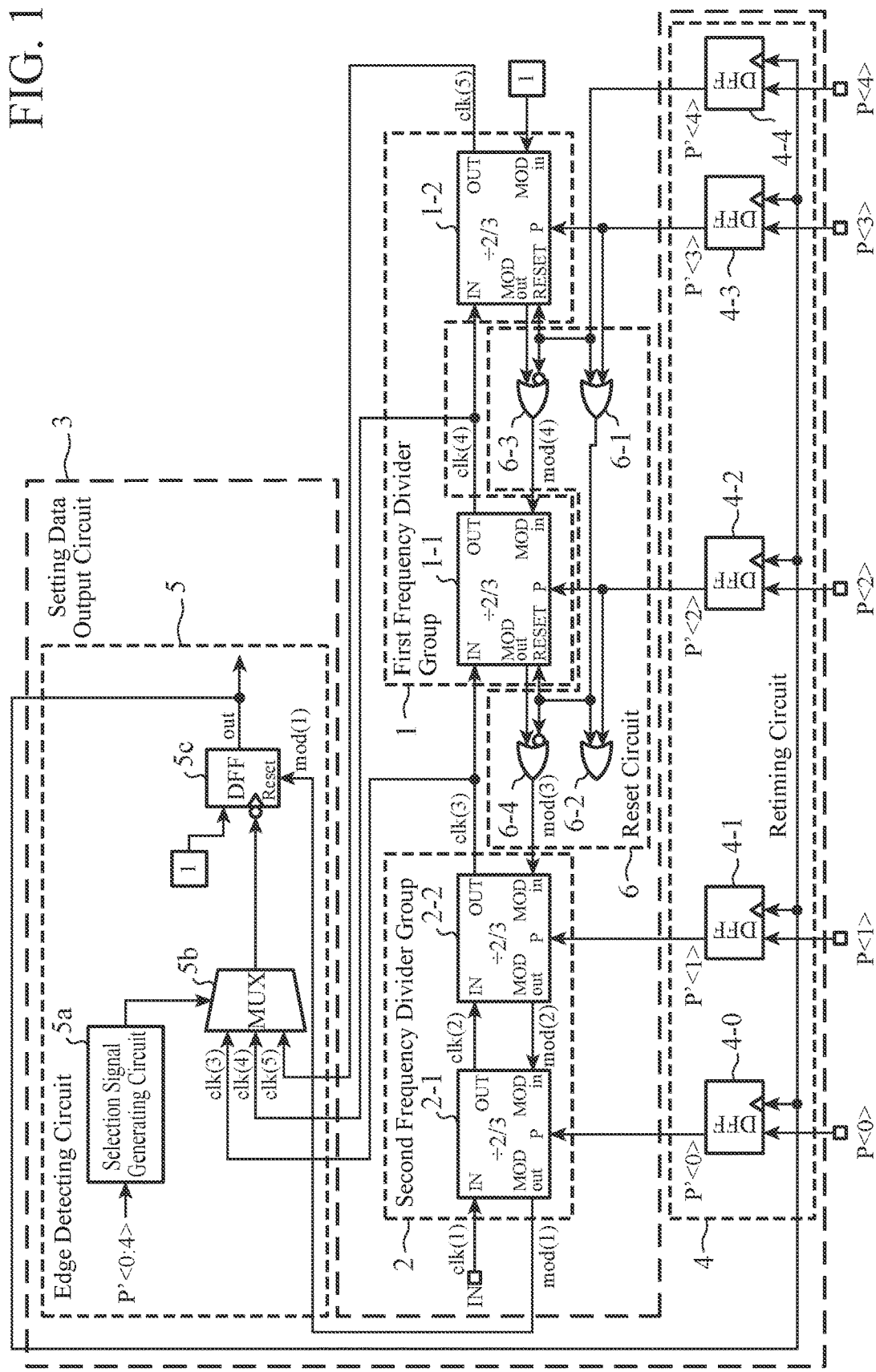
FIG. 1 is a configuration diagram illustrating a variable frequency divider according to a first embodiment of the present invention.

FIG. 1 is a configuration diagram illustrating a variable frequency divider according to a first embodiment of the present invention.

In FIG. 1, a first frequency divider group 1 includes two dual modulus frequency dividers 1-1 and 1-2.

In the example in FIG. 1, the first frequency divider group 1 includes two dual modulus frequency dividers. Note that, this is merely an example, and the first frequency divider group 1 may include three or more dual modulus frequency dividers.

The dual modulus frequency dividers 1-1 and 1-2 are connected in series, and an output terminal OUT of a clock signal "clk(4)" in the dual modulus frequency divider 1-1 is connected to an input terminal IN of the clock signal "clk(4)" in the dual modulus frequency divider 1-2.

In a state in which a significant reset signal is provided from a reset circuit 6, that is, in a state in which the reset signal having the L level is provided, an internal state of each of the dual modulus frequency dividers 1-1 and 1-2 is initialized, and each of the dual modulus frequency dividers 1-1 and 1-2 outputs a signal having the L level from the output terminal OUT and, irrespective of the signal level of a frequency dividing ratio control signal "mod" input from a MODin terminal, outputs the frequency dividing ratio control signal "mod" having the L level from a MODout terminal. In this case, the dual modulus frequency dividers 1-1 and 1-2 become invalid dual modulus frequency dividers which do not contribute to frequency dividing operation.

In a state in which a non-significant reset signal is provided from the reset circuit 6, that is, in a state in which the reset signal having the H level is provided, the dual modulus frequency dividers 1-1 and 1-2 become valid and contribute to the frequency dividing operation, and in a case in which the frequency dividing ratio control signal "mod" having the L level is input from the MODin terminal, the frequency dividing ratio thereof is set to 2 (first frequency dividing ratio).

Further, in a state in which the reset signal having the H level is provided, in a case in which the frequency dividing ratio control signal "mod" having the H level is input from the MODin terminal, the following setting is performed in the dual modulus frequency dividers 1-1 and 1-2. When signal levels of frequency dividing ratio setting signals P'<2> and P'<3> which are setting data of the frequency dividing ratio output from flip-flops 4-2 and 4-3 of a retiming circuit 4 are the L levels, the frequency dividing ratio is set to 2. When the signal levels of the frequency dividing ratio setting signals P'<2> and P'<3> are the H levels, the frequency dividing ratio is set to 3 (second frequency dividing ratio).

Then, each of the dual modulus frequency dividers 1-1 and 1-2 frequency-divides a clock signal "clk" (input signal) input from the input terminal IN with the set frequency dividing ratio, and outputs a frequency divided signal of the clock signal "clk" from the output terminal OUT.

That is, the dual modulus frequency divider 1-1 frequency-divides a clock signal "clk(3)" with the set frequency dividing ratio and outputs the clock signal "clk(4)" which is the frequency divided signal of the clock signal "clk(3)".

The dual modulus frequency divider 1-2 frequency-divides the clock signal "clk(4)" with the set frequency dividing ratio and outputs a clock signal "clk(5)" which is the frequency divided signal of the clock signal "clk(4)".

In the above process, the frequency dividing ratio control signal "mod" having the L level corresponds to a first control signal indicating that the frequency dividing ratio is fixed to 2. The frequency dividing ratio control signal "mod" having the H level corresponds to a second control signal indicating that the frequency dividing ratio is allowed to be variable. In the first embodiment, the frequency dividing ratio is variable and can be changed to 2 or 3.

Note that, the dual modulus frequency divider 1-1 outputs the frequency dividing ratio control signal "mod" for generating a frequency dividing ratio control signal "mod(3)" from the MODout terminal to an OR gate 6-4 in accordance with a frequency dividing ratio control signal "mod(4)" input from the MODin terminal and the clock signal "clk(3)" input from the input terminal IN.

The dual modulus frequency divider 1-2 outputs the frequency dividing ratio control signal "mod" for generating the frequency dividing ratio control signal "mod(4)" from the MODout terminal to an OR gate 6-3 in accordance with the signal having the H level input from the MODin terminal and the clock signal "clk(4)" input from the input terminal IN.

A second frequency divider group 2 includes two dual modulus frequency dividers 2-1 and 2-2 connected to a preceding stage of the first frequency divider group 1 in series.

In the example in FIG. 1, the second frequency divider group 2 includes two dual modulus frequency dividers. Note that, this is merely an example, and the second frequency divider group 2 may include three or more dual modulus frequency dividers.

The dual modulus frequency dividers 2-1 and 2-2 are connected in series, and an output terminal OUT of a clock signal "clk(2)" in the dual modulus frequency divider 2-1 is connected to an input terminal IN of the clock signal "clk(2)" in the dual modulus frequency divider 2-2, and an output terminal OUT of the clock signal "clk(3)" in the dual modulus frequency divider 2-2 is connected to an input terminal IN of the clock signal "clk(3)" in the dual modulus frequency divider 1-1.

In a case in which the frequency dividing ratio control signal "mod" having the L level is input from the MODin terminal, the frequency dividing ratio of the dual modulus frequency dividers 2-1 and 2-2 is set to 2.

In a case in which the frequency dividing ratio control signal "mod" having the H level is input from the MODin terminal, the following setting is performed in the dual modulus frequency dividers 2-1 and 2-2. When signal levels of frequency dividing ratio setting signals P'<0> and P'<1> which are setting data of the frequency dividing ratio output from flip-flops 4-0 and 4-1 of the retiming circuit 4 are the L levels, the frequency dividing ratio is set to 2. When the signal levels of the frequency dividing ratio setting signals P'<0> and P'<1> are the H levels, the frequency dividing ratio is set to 3.

Then, each of the dual modulus frequency dividers 2-1 and 2-2 frequency-divides the clock signal "clk" input from the input terminal IN with the set frequency dividing ratio, and outputs the frequency divided signal of the clock signal "clk" from the output terminal OUT.

That is, the dual modulus frequency divider 2-1 frequency-divides a clock signal "clk(1)" with the set frequency dividing ratio, and outputs the clock signal "clk(2)" which is the frequency divided signal of the clock signal "clk(1)".

The dual modulus frequency divider 2-2 frequency-divides the clock signal "clk(2)" with the set frequency dividing ratio, and outputs the clock signal "clk(3)" which is the frequency divided signal of the clock signal "clk(2)".

Note that, the dual modulus frequency divider 2-1 outputs the frequency dividing ratio control signal "mod(1)" from the MODout terminal on the basis of a frequency dividing ratio control signal "mod(2)" input from the MODin terminal and the clock signal "clk(1)" input from the input terminal IN.

The dual modulus frequency divider 2-2 outputs the frequency dividing ratio control signal "mod(2)" from the MODout terminal on the basis of the frequency dividing ratio control signal "mod(3)" input from the MODin terminal and the clock signal "clk(2)" input from the input terminal IN.

A setting data output circuit 3 includes the retiming circuit 4 and an edge detecting circuit 5, holds an externally provided frequency dividing ratio setting signals P<0:4> and outputs frequency dividing ratio setting signals P'<0:4> obtained by retiming the frequency dividing ratio setting signals P<0:4> to the dual modulus frequency dividers 2-1, 2-2, 1-1, and 1-2.

The retiming circuit 4 includes the flip-flops 4-0 to 4-4.

The flip-flops 4-0 to 4-4 hold externally provided frequency dividing ratio setting signals P<0> to P<4> and output frequency dividing ratio setting signals P'<0> to P'<4> obtained by retiming the frequency dividing ratio setting signals P<0> to P<4> to the dual modulus frequency dividers 2-1, 2-2, 1-1, and 1-2 in synchronization with a rising edge of a clock signal "out" output from the edge detecting circuit 5.

The edge detecting circuit 5 includes a selection signal generating circuit 5a, a multiplexer 5b, and a flip-flop 5c.

The selection signal generating circuit 5a determines the clock signal "clk" to be selected out of the clock signals "clk(3)" to "clk(5)" in accordance with the frequency dividing ratio setting signals P'<0:4> output from the retiming circuit 4 and outputs a selection signal indicating that the determined clock signal "clk" is selected to the multiplexer 5b.

That is, in a case in which a value of the frequency dividing ratio setting signals P'<0:4> output from the retiming circuit 4 is 4 to 7, the selection signal generating circuit 5a outputs the selection signal indicating that the clock signal "clk(3)" is selected to the multiplexer 5b. In a case in which the value of the frequency dividing ratio setting signals P'<0:4> is 8 to 15, the selection signal generating circuit 5a outputs the selection signal indicating that the clock signal "clk(4)" is selected to the multiplexer 5b. In a case in which the value of the frequency dividing ratio setting signals P'<0:4> is 16 to 31, the selection signal generating circuit 5a outputs the selection signal indicating that the clock signal "clk(5)" is selected to the multiplexer 5b.

The multiplexer 5b selects the clock signal "clk" indicated by the selection signal output from the selection signal generating circuit 5a out of the clock signals "clk(3)" to "clk(5)", and outputs the selected clock signal "clk" to the flip-flop 5c.

When the clock signal "clk" output from the multiplexer 5b falls, the flip-flop 5c outputs a signal having the H level as the clock signal "out". When the frequency dividing ratio control signal "mod(1)" output from the MODout terminal of the dual modulus frequency divider 2-1 rises, the flip-flop 5c outputs a signal having the L level as the clock signal "out".

The reset circuit 6 includes logical OR gates (hereinafter referred to as "OR gates") 6-1 to 6-4 and generates a significant or non-significant reset signal in accordance with the frequency dividing ratio setting signals P'<3:4> output from the retiming circuit 4, and outputs the significant or non-significant reset signal to the dual modulus frequency dividers 1-1 and 1-2.

That is, in a case in which a signal level of the frequency dividing ratio setting signal P'<4> is the L level, the reset circuit 6 outputs the reset signal having the L level to the dual modulus frequency divider 1-2 as the significant reset signal. In a case in which the signal level of the frequency dividing ratio setting signal P'<4> is the H level, the reset circuit 6 outputs the reset signal having the H level to the dual modulus frequency divider 1-2 as the non-significant reset signal.

Further, in a case in which a signal level of the frequency dividing ratio setting signals P'<3:4> is the L level, the reset circuit 6 outputs the reset signal having the L level as the significant reset signal to the dual modulus frequency divider 1-1. In a case in which the signal level of at least one of the frequency dividing ratio setting signal P'<3> and the frequency dividing ratio setting signal P'<4> is the H level, the reset circuit 6 outputs the reset signal having the H level as the non-significant reset signal to the dual modulus frequency divider 1-1.

In a case in which the signal level of at least one of the frequency dividing ratio setting signal P'<3> and the frequency dividing ratio setting signal P'<4> is the H level, the OR gate 6-1 outputs the reset signal having the H level. In a case in which the signal levels of the frequency dividing ratio setting signal P'<3> and the frequency dividing ratio setting signal P'<4> are the L levels, the OR gate 6-1 outputs the reset signal having the L level.

Although the OR gate 6-2 is provided in FIG. 1, the OR gate 6-2 does not operate at all, so that it is not necessary to provide the OR gate 6-2. In this case, the OR gate 6-2 is provided because, in a case in which the number of dual modulus frequency dividers forming the first frequency divider group 1 is large, it is sometimes more beneficial to mount the same number of OR gates as the dual modulus frequency dividers in printing of a printed board and the like.

The OR gate 6-3 outputs the frequency dividing ratio control signal "mod(4)" having the L level to the MODin terminal of the dual modulus frequency divider 1-1 in a case in which the signal level of the frequency dividing ratio control signal "mod" output from the MODout terminal of the dual modulus frequency divider 1-2 is the L level and the signal of the frequency dividing ratio setting signal P'<4> is the H level.

The OR gate 6-3 outputs the frequency dividing ratio control signal "mod(4)" having the H level to the MODin terminal of the dual modulus frequency divider 1-1 in a case in which the signal level of the frequency dividing ratio control signal "mod" output from the MODout terminal of the dual modulus frequency divider 1-2 is the H level or the signal of the frequency dividing ratio setting signal P'<4> is the L level.

The OR gate 6-4 outputs the frequency dividing ratio control signal "mod(3)" having the L level to the MODin terminal of the dual modulus frequency divider 2-2 in a case in which the signal level of the frequency dividing ratio control signal "mod" output from the MODout terminal of the dual modulus frequency divider 1-1 is the L level and the signal level of the reset signal output from the OR gate 6-1 is the H level.

The OR gate 6-4 outputs the frequency dividing ratio control signal "mod(3)" having the H level to the MODin terminal of the dual modulus frequency divider 2-2 in a case in which the signal level of the frequency dividing ratio control signal "mod" output from the MODout terminal of the dual modulus frequency divider 1-1 is the H level or the signal level of the reset signal output from the OR gate 6-1 is the L level.

Figure 2:
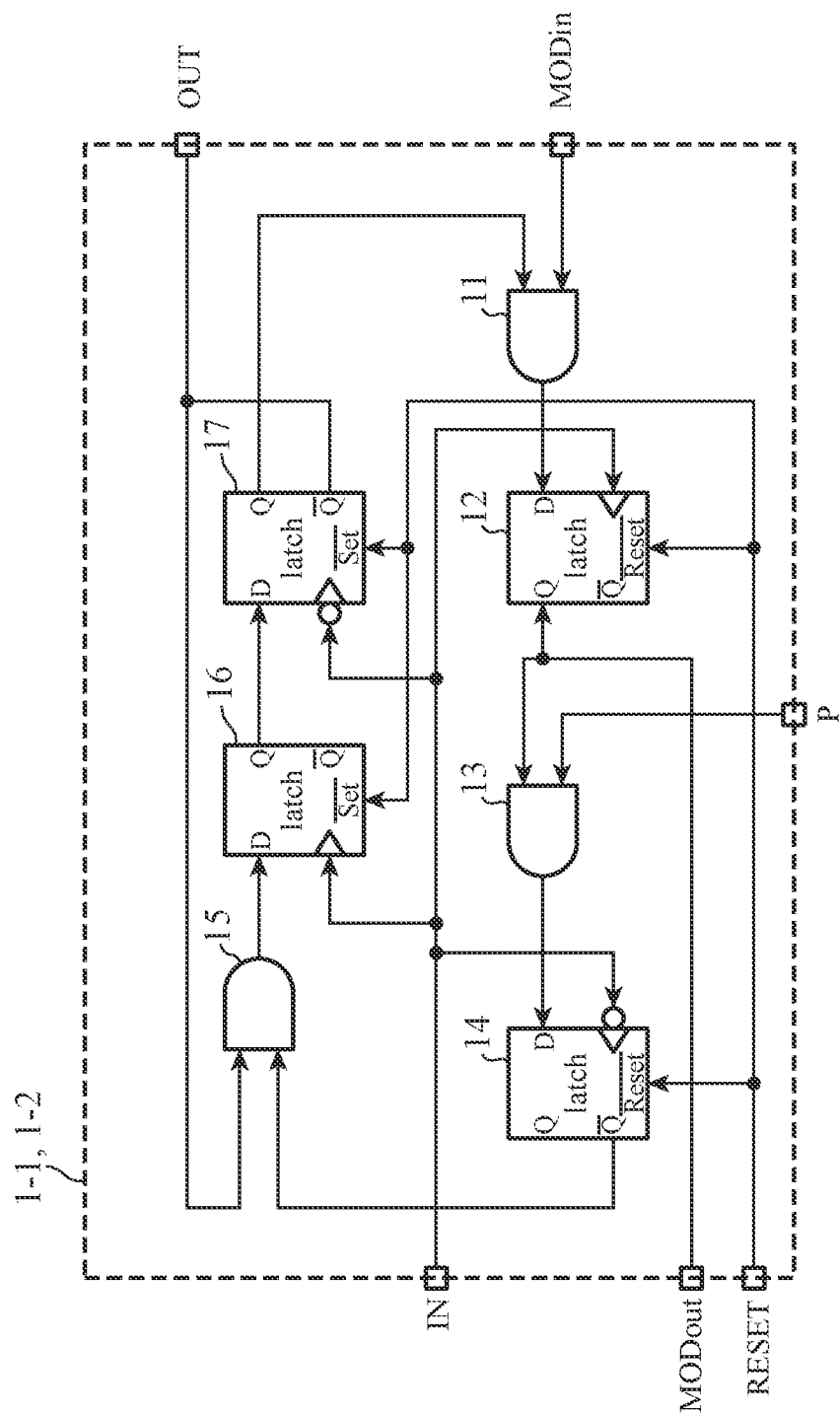
FIG. 2 is a configuration diagram illustrating dual modulus frequency dividers 1-1 and 1-2 of the variable frequency divider according to the first embodiment of the present invention.

FIG. 2 is a configuration diagram illustrating the dual modulus frequency dividers 1-1 and 1-2 of the variable frequency divider according to the first embodiment of the present invention.

In FIG. 2, a logical AND gate (hereinafter referred to as an "AND gate") 11 outputs a signal having the H level to a high through latch (hereinafter, referred to as a "high through latch") 12 when the signal levels of the frequency dividing ratio control signal "mod" input from the MODin terminal and an inverted signal of the frequency divided signal output from a low through latch (hereinafter referred to as a "low through latch") 17 are the H levels. The logical AND gate 11 outputs the signal having the L level to the high through latch 12 when the signal level of at least one of the frequency dividing ratio control signal "mod" and the inverted signal is the L level.

In a state in which the signal level of the clock signal "clk" input from the input terminal IN is the H level, when the high through latch 12 receives a signal from the AND gate 11, the high through latch 12 outputs the received signal as the frequency dividing ratio control signal "mod" from a Q terminal to an AND gate 13 and the MODout terminal. In a state in which the signal level of the clock signal "clk" is the L level, the high through latch 12 holds the signal level of the signal output from the Q terminal.

Further, the high through latch 12 has a resetting function, and when a reset signal having the L level is provided to a RESET terminal, the high through latch 12 outputs the frequency dividing ratio control signal "mod" having the L level from the Q terminal to the AND gate 13 and the MODout terminal.

The AND gate 13 outputs the signal having the H level to a low through latch 14 when the signal levels of the frequency dividing ratio control signal "mod" output from the high through latch 12 and the frequency dividing ratio setting signal P' input from a P terminal are the H levels. The AND gate 13 outputs the signal having the L level to the low through latch 14 when the signal level of at least one of the frequency dividing ratio control signal "mod" and the frequency dividing ratio set signal P' is the L level.

In a state in which the signal level of the clock signal "clk" input from the input terminal IN is the L level, when the low through latch 14 receives a signal from the AND gate 13, the low through latch 14 outputs the signal obtained by inverting the signal level of the received signal from a Q bar terminal to an AND gate 15. In a state in which the signal level of the clock signal "clk" is the H level, the low through latch 14 holds the signal level of the signal output from the Q bar terminal.

In this specification, it is not possible to attach the symbol "-" on the top of the character Q due to the electronic filing system of patent application, so that the symbol is represented as "Q bar".

Further, the low through latch 14 has a resetting function, and when the reset signal having the L level is provided to a RESET terminal, the low through latch 14 outputs the signal having the H level from the Q bar terminal to the AND gate 15.

The AND gate 15 outputs the signal having the H level to a high through latch 16 when the signal levels of the signal output from the low through latch 14 and the frequency divided signal output from a low through latch 17 are the H levels. The AND gate 15 outputs the signal having the L level to the high through latch 16 when the signal level of at least one of the signal output from the low through latch 14 and the frequency divided signal is the L level.

In a state in which the signal level of the clock signal "clk" input from the input terminal IN is the H level, when the high through latch 16 receives a signal from the AND gate 15, the high through latch 16 outputs the signal from the Q terminal to the Low trough latch 17. In a state in which the signal level of the clock signal "clk" is the L level, the high through latch 16 holds the signal level of the signal output from the Q terminal.

Further, the high through latch 16 has a setting function, and outputs the signal having the H level from the Q terminal to the low through latch 17 when the reset signal having the L level is provided to a SET terminal.

In a state in which the signal level of the clock signal "clk" input from the input terminal IN is the L level, when the low through latch 17 receives a signal from the high through latch 16, the low through latch 17 outputs the inverted signal of the received signal as the frequency divided signal of the clock signal "clk" from the Q bar terminal to the output terminal OUT and the AND gate 15, and outputs the signal output from the high through latch 16 as the inverted signal of the frequency divided signal from the Q terminal to the AND gate 11. In a state in which the signal level of the clock signal "clk" input from the input terminal IN is the H level, the low through latch 17 holds the signal levels of the signals output from the Q terminal and the Q bar terminal.

Further, the low through latch 17 has a setting function, and when a reset signal having the L level is provided to a SET terminal, the low through latch 17 outputs the frequency divided signal having the L level from the Q bar terminal to the output terminal OUT and the AND gate 15 and outputs the inverted signal having the H level from the Q terminal to the AND gate 11.

Figure 3:
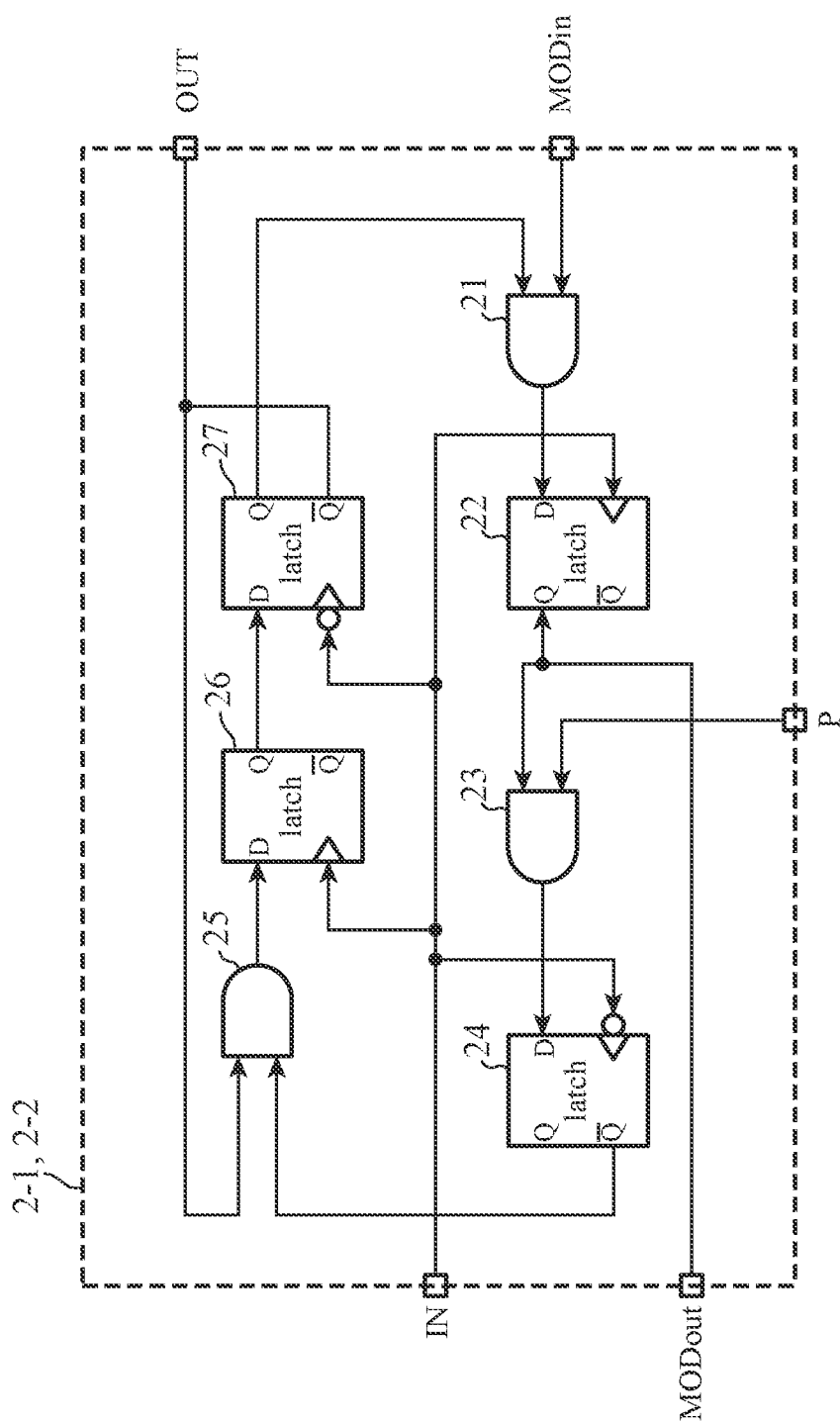
FIG. 3 is a configuration diagram illustrating dual modulus frequency dividers 2-1 and 2-2 of the variable frequency divider according to the first embodiment of the present invention.

FIG. 3 is a configuration diagram illustrating the dual modulus frequency dividers 2-1 and 2-2 of the variable frequency divider according to the first embodiment of the present invention.

In FIG. 3, an AND gate 21 outputs a signal having the H level to a high through latch 22 when the signal levels of the frequency dividing ratio control signal "mod" input from the MODin terminal and the inverted signal of the frequency divided signal output from a low through latch 27 are the H levels. The AND gate 21 outputs the signal having the L level to the high through latch 22 when the signal level of at least one of the frequency dividing ratio control signal "mod" and the inverted signal is the L level.

In a state in which the signal level of the clock signal "clk" input from the input terminal IN is the H level, when the high through latch 22 receives a signal from the AND gate 21, the high through latch 22 outputs the signal as the frequency dividing ratio control signal "mod" from the Q terminal to an AND gate 23 and the MODout terminal, and in a state in which the signal level of the clock signal "clk" is the L level, the high through latch 22 holds the signal level of the signal output from the Q terminal.

The AND gate 23 outputs the signal having the H level to a low through latch 24 when the signal levels of the frequency dividing ratio control signal "mod" output from the high through latch 22 and the frequency dividing ratio setting signal P' input from the P terminal are the H levels. The AND gate 23 outputs the signal having the L level to the low through latch 24 when the signal level of at least one of the frequency dividing ratio control signal "mod" and the frequency dividing ratio set signal P' is the L level.

In a state in which the signal level of the clock signal "clk" input from the input terminal IN is the L level, when the low through latch 24 receives a signal from the AND gate 23, the low through latch 24 outputs the signal obtained by inverting the signal level of the signal from the Q bar terminal to an AND gate 25. In a state in which the signal level of the clock signal "clk" is the H level, the low through latch 24 holds the signal level of the signal output from the Q bar terminal.

The AND gate 25 outputs the signal having the H level to a high through latch 26 when the signal levels of the signal output from the low through latch 24 and the frequency divided signal output from the low through latch 27 are the H levels. The AND gate 25 outputs the signal having the L level to the high through latch 26 when the signal level of at least one of the signal output from the low through latch 24 and the frequency divided signal is the L level.

In a state in which the signal level of the clock signal "clk" input from the input terminal IN is the H level, when the high through latch 26 receives a signal from the AND gate 25, the high through latch 26 outputs the received signal from the Q terminal to the Low trough latch 27. In a state in which the signal level of the clock signal "clk" is the L level, the high through latch 26 holds the signal level of the signal output from the Q terminal.

In a state in which the signal level of the clock signal "clk" input from the input terminal IN is the L level, when the low through latch 27 receives a signal from the high through latch 26, the low through latch 27 outputs the inverted signal of the received signal as the frequency divided signal of the clock signal "clk" from the Q bar terminal to the output terminal OUT and the AND gate 25, and outputs the signal output from the high through latch 26 as the inverted signal of the frequency divided signal from the Q terminal to the AND gate 21. In a case in which the signal level of the clock signal "clk" input from the input terminal IN is the H level, the low through latch 27 holds the signal levels of the signals output from the Q terminal and the Q bar terminal.

Next, an operation will be described.

In the first embodiment, for the purpose of illustration, it is assumed that, in the dual modulus frequency dividers 1-1 and 1-2 in the first frequency divider group 1, the frequency dividing operation of the dual modulus frequency divider 1-2 is invalidated, and the frequency dividing ratio of the dual modulus frequency divider 1-1 in which the frequency dividing operation is valid is set to 3.

In the following, it is described that, when the first frequency divider group 1 operates in the above state, even when the frequency dividing operation of the dual modulus frequency divider 1-1 is invalidated and thereby the number of valid dual modulus frequency dividers contributing to the frequency dividing operation is decreased, normal frequency dividing operation is realized.

Figure 4:
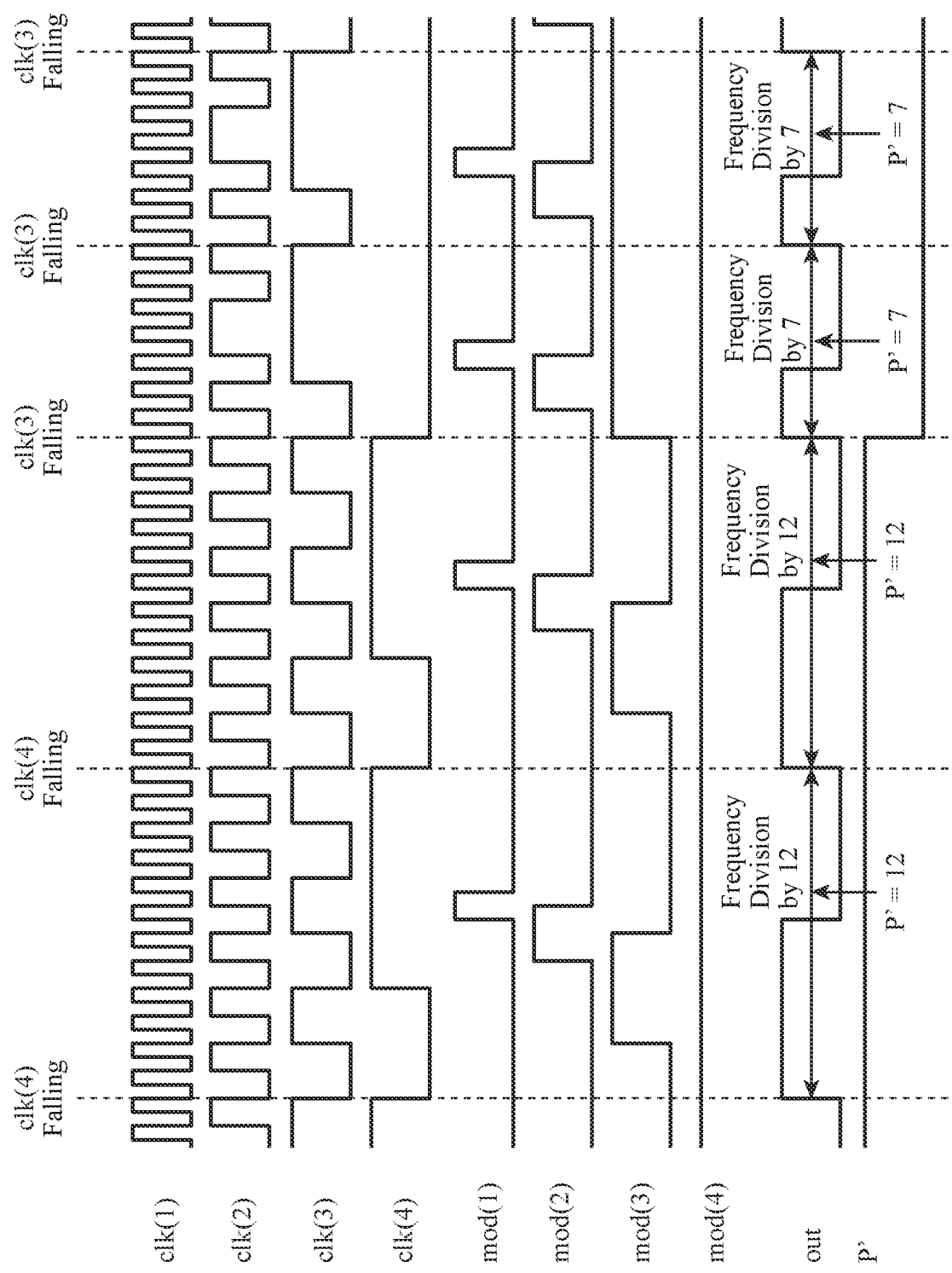
FIG. 4 is a diagram illustrating waveforms of various signals when a frequency dividing ratio of the variable frequency divider is changed from 12 to 7.

FIG. 4 is an illustrative view showing waveforms of various signals when the frequency dividing ratio of the variable frequency divider is changed from 12 to 7.

Hereinafter, with reference to FIG. 4, operation when the frequency dividing ratio of the variable frequency divider is changed from 12 to 7 is described.

In a case in which the frequency dividing ratio of the variable frequency divider is set to 12, values of the frequency dividing ratio setting signals P<0:4> externally provided to the flip-flops 4-0 to 4-4 of the retiming circuit 4 are as follows.

P<0>=0
P<1>=0
P<2>=1
P<3>=1
P<4>=0

Therefore, the retimed frequency dividing ratio setting signals P'<0:4> are output from the flip-flops 4-0 to 4-4 of the retiming circuit 4 to the dual modulus frequency dividers 2-1, 2-2, 1-1, and 1-2 and the selection signal generating circuit 5a of the edge detecting circuit 5. Further, retimed frequency dividing ratio setting signals P'<2:4> are output from the flip-flops 4-2 to 4-4 to the reset circuit 6. The timing at which the frequency dividing ratio setting signals P'<0:4> are output from the flip-flops 4-0 to 4-4 is the timing at which the clock signal "out" output from the flip-flop 5c of the edge detecting circuit 5, which will be described later, rises.

As a result, the frequency dividing ratio setting signal P'<0>=0 is provided to the P terminal of the dual modulus frequency divider 2-1, and the frequency dividing ratio setting signal P'<1>=0 is provided to the P terminal of the dual modulus frequency divider 2-2.

The frequency dividing ratio setting signal P'<2>=1 is provided to the P terminal of the dual modulus frequency divider 1-1, and the frequency dividing ratio setting signal P'<3>=1 is provided to the P terminal of the dual modulus frequency divider 1-2.

The frequency dividing ratio setting signal P'<4>=0 is provided to a RESET terminal of the dual modulus frequency divider 1-2.

Since the frequency dividing ratio setting signal P'<4>=0 is a significant reset signal, that is, a reset signal having the L level, the internal state of the dual modulus frequency divider 1-2 in the first frequency divider group 1 is initialized and the frequency dividing operation is invalidated.

That is, in the high through latch 12 of the dual modulus frequency divider 1-2, when the reset signal having the L level is provided to the RESET terminal, the signal level of the frequency dividing ratio control signal "mod" output from the Q terminal is initialized to the L level. As a result, the frequency dividing ratio control signal "mod" having the L level is output from the MODout terminal of the dual modulus frequency divider 1-2 to the OR gate 6-3.

In the low through latch 14 of the dual modulus frequency divider 1-2, when the reset signal having the L level is provided to the RESET terminal, the signal level of the signal output from the Q bar terminal is initialized to the H level.

In the high through latch 16 of the dual modulus frequency divider 1-2, when the reset signal having the L level is provided to the SET terminal, the signal level of the signal output from the Q terminal is initialized to the H level.

In the low through latch 17 of the dual modulus frequency divider 1-2, when the reset signal having the L level is provided to the SET terminal, the signal level of the frequency divided signal of the clock signal "clk(4)" output from the Q bar terminal, that is, the clock signal "clk(5)" is initialized to the L level. The signal level of the signal output from the Q terminal is initialized to the H level.

At this time, although the OR gate 6-3 receives the frequency dividing ratio control signal "mod" having the L level from the dual modulus frequency divider 1-2, the OR gate 6-3 receives the frequency dividing ratio setting signal P'<4>=0 from the flip-flop 4-4, so that the OR gate 6-3 outputs the frequency dividing ratio control signal "mod(4)" having the H level to the dual modulus frequency divider 1-1 as illustrated in FIG. 4.

Further, although the OR gate 6-1 receives the frequency dividing ratio setting signal P'<4>=0 from the flip-flop 4-4, the OR gate 6-1 receives the frequency dividing ratio setting signal P'<3>=1 from the flip 4-3, so that the OR gate 6-1 outputs the signal having the H level to the OR gate 6-4 and the RESET terminal of the dual modulus frequency divider 1-1.

Since the signal having the H level is the non-significant reset signal, that is, the reset signal having the H level, the internal state of the dual modulus frequency divider 1-1 is not initialized and the frequency dividing operation is validated.

The dual modulus frequency divider 1-1 in the first frequency divider group 1 receives the frequency dividing ratio control signal "mod(4)" having the H level from the OR gate 6-3, and receives the frequency dividing ratio setting signal P'<2>=1 from the flip-flop 4-2. Thus, the frequency dividing ratio is set to 3.

That is, since the frequency dividing ratio control signal "mod(4)" having the H level is input to the AND gate 11 of the dual modulus frequency divider 1-1, the inverted signal of the frequency divided signal output from the Q terminal of the low through latch 17 passes through the AND gate 11 and is output to the high through latch 12.

Further, since the frequency dividing ratio setting signal P'<2>=1 is input to the AND gate 13 of the dual modulus frequency divider 1-1, the signal output from the high through latch 12 passes through the AND gate 13 and is output to the low through latch 14 in synchronization with the clock signal "clk(3)" input from the input terminal IN.

Therefore, since the AND gate 11 and the high through latch 12 contribute to the frequency dividing operation together with the AND gate 13, the low through latch 14, the AND gate 15, the high through latch 16, and the low through latch 17, the frequency dividing ratio is set to 3.

As a result, as illustrated in FIG. 4, the dual modulus frequency divider 1-1 frequency-divides the clock signal "clk(3)" by 3 in synchronization with a falling edge of the clock signal "clk(3)" input from the input terminal IN and outputs the clock signal "clk(4)" which is the frequency divided signal of the clock signal "clk(3)" from the output terminal OUT to the dual modulus frequency divider 1-2 and the multiplexer 5b of the edge detecting circuit 5 on the subsequent stage.

Note that, in a case in which the frequency dividing ratio setting signal P'<2>=0, the signal level of the output signal of the AND gate 13 is always the L level and the AND gate 11 and the high through latch 12 do not contribute to the frequency dividing operation, so that the frequency dividing ratio is set to 2. In a case in which the frequency dividing ratio is 2, only the low through latch 14, the AND gate 15, the high through latch 16, and the low through latch 17 contribute to the frequency dividing operation.

Further, as illustrated in FIG. 4, the dual modulus frequency divider 1-1 frequency-divides the clock signal "clk(3)" by 2 in synchronization with a rising edge of the clock signal "clk(3)" input from the input terminal IN and outputs the signal obtained by frequency-dividing the clock signal "clk(3)" by 2 from the MODout terminal as the frequency dividing ratio control signal "mod".

That is, the AND gate 11 of the dual modulus frequency divider 1-1 outputs the signal having the H level to the high through latch 12 when the signal levels of the frequency dividing ratio control signal "mod(4)" input from the MODin terminal and the inverted signal of the frequency divided signal output from the low through latch 17 are the H levels, and outputs the signal having the L level to the high through latch 12 when the signal level of at least one of the frequency dividing ratio control signal "mod(4)" and the inverted signal is the L level.

In a state in which the signal level of the clock signal "clk(3)" input from the input terminal IN is the H level, when the high through latch 12 of the dual modulus frequency divider 1-1 receives the signal from the AND gate 11, the high through latch 12 outputs the signal from the Q terminal to the MODout terminal as the frequency dividing ratio control signal "mod", and in a case in which the signal level of the clock signal "clk(3)" is the L level, the high through latch 12 holds the signal level of the signal output from the Q terminal.

Therefore, the dual modulus frequency divider 1-1 outputs the signal obtained by frequency-dividing the clock signal "clk(3)" by 2 as the frequency dividing ratio control signal "mod".

In the example in FIG. 4, the frequency dividing ratio control signal "mod" having the H level is output in a period from the rising of the first clock signal "clk(3)" to the rising of the second clock signal "clk(3)" in the time started from the timing of "clk(4) falling" shown in FIG. 4. As is described later, the frequency dividing ratio control signal "mod" corresponds to the frequency dividing ratio control signal "mod(3)" output from the OR gate 6-4.

Since the OR gate 6-4 receives the signal having the H level from the OR gate 6-1, the OR gate 6-4 outputs the frequency dividing ratio control signal "mod" output from the dual modulus frequency divider 1-1 to be unchanged to the dual modulus frequency divider 2-2 as the frequency dividing ratio control signal "mod(3)".

Since the dual modulus frequency divider 2-2 in the second frequency divider group 2 receives the frequency dividing ratio setting signal P'<1>=0 from the flip-flop 4-1, the frequency dividing ratio is set to 2 regardless of the signal level of the frequency dividing ratio control signal "mod(3)" output from the OR gate 6-4.

That is, since the frequency dividing ratio setting signal P'<1>=0 is input to the AND gate 23 of the dual modulus frequency divider 2-2, the signal level of the output signal of the AND gate 23 is always the L level irrespective of the signal level of the clock signal "clk(2)" input from the input terminal IN and the signal level of the frequency dividing ratio control signal "mod(3)" output from the OR gate 6-4. Therefore, since the AND gate 21 and the high through latch 22 do not contribute to the frequency dividing operation, the frequency dividing ratio is set to 2. In the case that the frequency dividing ratio is 2, only the low through latch 24, the AND gate 25, the high through latch 26, and the low through latch 27 contribute to the frequency dividing operation.

As a result, as illustrated in FIG. 4, the dual modulus frequency divider 2-2 frequency-divides the clock signal "clk(2)" input from the input terminal IN by 2 and outputs the clock signal "clk(3)" which is the frequency divided signal of the clock signal "clk(2)" from the output terminal OUT to the dual modulus frequency divider 1-1 on the subsequent stage.

Note that, in the case in which the frequency dividing ratio setting signal P'<1>=1, in a period in which the frequency dividing ratio control signal "mod(3)" having the H level is output from the OR gate 6-4, the signal output from the high through latch 22 passes through the AND gate 23 and is output to the low through latch 24 in synchronization with the clock signal "clk(2)" input from the input terminal IN.

Therefore, since the AND gate 21 and the high through latch 22 contribute to the frequency dividing operation together with the AND gate 23, the low through latch 24, the AND gate 25, the high through latch 26, and the low through latch 27, the frequency dividing ratio is set to 3.

Further, as illustrated in FIG. 4, the dual modulus frequency divider 2-2 frequency-divides the clock signal "clk(2)" by 2 in synchronization with a rising edge of the clock signal "clk(2)" input from the input terminal IN and outputs the signal obtained by frequency-dividing the clock signal "clk(2)" by 2 from the MODout terminal as the frequency dividing ratio control signal "mod(2)".

That is, the AND gate 21 of the dual modulus frequency divider 2-2 outputs the signal having the H level to the high through latch 22 when the signal levels of the frequency dividing ratio control signal "mod(3)" input from the MODin terminal and the inverted signal of the frequency divided signal output from the low through latch 27 are the H levels, and outputs the signal having the L level to the high through latch 22 when the signal level of at least one of the frequency dividing ratio control signal "mod(3)" and the inverted signal is the L level.

In a state in which the signal level of the clock signal "clk(2)" input from the input terminal IN is the H level, when the high through latch 22 of the dual modulus frequency divider 2-2 receives the signal from the AND gate 21, the high through latch 22 outputs the signal from the Q terminal to the MODout terminal as the frequency dividing ratio control signal "mod(2)", and in a case in which the signal level of the clock signal "clk(2)" is the L level, the high through latch 22 holds the signal level of the signal output from the Q terminal.

In the example shown in FIG. 4, the frequency dividing ratio control signal "mod(2)" having the H level is output in a period from the rising of the third clock signal "clk(2)" to the rising of the fourth clock signal "clk(2)" in the time started from the timing of "clk(4) falling" shown in FIG. 4.

Since the dual modulus frequency divider 2-1 in the second frequency divider group 2 receives the frequency dividing ratio setting signal P'<0>=0 from the flip-flop 4-0, the frequency dividing ratio is set to 2 regardless of the signal level of the frequency dividing ratio control signal "mod(2)" output from the dual modulus frequency divider 2-2.

That is, since the frequency dividing ratio setting signal P'<0>=0 is input to the AND gate 23 of the dual modulus frequency divider 2-1, the signal level of the output signal of the AND gate 23 is always the L level irrespective of the signal level of the clock signal "clk(1)" input from the input terminal IN and the signal level of the frequency dividing ratio control signal "mod(2)" output from the dual modulus frequency divider 2-2. As a result, since the AND gate 21 and the high through latch 22 do not contribute to the frequency dividing operation, the frequency dividing ratio is set to 2. In the case that the frequency dividing ration is 2, only the low through latch 24, the AND gate 25, the high through latch 26, and the low through latch 27 contribute to the frequency dividing operation.

As a result, as illustrated in FIG. 4, the dual modulus frequency divider 2-1 frequency-divides the clock signal "clk(1)" input from the input terminal IN by 2 and outputs the clock signal "clk(2)" which is the frequency divided signal of the clock signal "clk(1)" from the output terminal OUT to the dual modulus frequency divider 2-2 on the subsequent stage.

Note that, in a case in which the frequency dividing ratio setting signal P'<0>=1, in a period in which the frequency dividing ratio control signal "mod(2)" having the H level is output from the dual modulus frequency divider 2-2, the signal output from the high through latch 22 passes through the AND gate 23 and is output to the low through latch 24 in synchronization with the clock signal "clk(1)" input from the input terminal IN.

As a result, since the AND gate 21 and the high through latch 22 contribute to the frequency dividing operation together with the AND gate 23, the low through latch 24, the AND gate 25, the high through latch 26, and the low through latch 27, the frequency dividing ratio is set to 3.

Further, as illustrated in FIG. 4, the dual modulus frequency divider 2-1 frequency-divides the clock signal "clk(1)" by 2 in synchronization with a rising edge of the clock signal "clk(1)" input from the input terminal IN and outputs the signal obtained by frequency-dividing the clock signal "clk(1)" by 2 from the MODout terminal as the frequency dividing ratio control signal "mod(1)" to the flip-flop 5c of the edge detecting circuit 5.

That is, the AND gate 21 of the dual modulus frequency divider 2-1 outputs the signal having the H level to the high through latch 22 when the signal levels of the frequency dividing ratio control signal "mod(2)" input from the MODin terminal and the inverted signal of the frequency divided signal output from the low through latch 27 are the H levels. The AND gate 21 outputs the signal having the L level to the high through latch 22 when the signal level of at least one of the frequency dividing ratio control signal "mod(2)" and the inverted signal is the L level.

In a state in which the signal level of the clock signal "clk(1)" input from the input terminal IN is the H level, when the high through latch 22 of the dual modulus frequency divider 2-1 receives a signal from the AND gate 21, the high through latch 22 outputs the signal from the Q terminal to the MODout terminal as the frequency dividing ratio control signal "mod(1)". In a case in which the signal level of the clock signal "clk(1)" is the L level, the high through latch 22 holds the signal level of the signal output from the Q terminal.

In the example in FIG. 4, the frequency dividing ratio control signal "mod(1)" having the H level is output in a period from the rising of the seventh clock signal "clk(1)" to the rising of the eighth clock signal "clk(1)" in the time started from the timing of "clk(4) falling" shown in FIG. 4.

The selection signal generating circuit 5a of the edge detecting circuit 5 determines the clock signal "clk" to be selected out of the clock signals "clk(3)" to "clk(5)" in accordance with the frequency dividing ratio setting signal P'<0:4> when receiving the frequency dividing ratio setting signal P'<0:4> from the retiming circuit 4, and outputs the selection signal indicating that the determined clock signal "clk" is to be selected to the multiplexer 5b.

That is, in a case in which the value of the frequency dividing ratio setting signals P'<0:4> output from the retiming circuit 4 is 4 to 7, the selection signal generating circuit 5a outputs the selection signal indicating that the clock signal "clk(3)" is to be selected to the multiplexer 5b. In a case in which the value of the frequency dividing ratio setting signals P'<0:4> is 8 to 15, the selection signal generating circuit 5a outputs the selection signal indicating that the clock signal "clk(4)" is to be selected to the multiplexer 5b. In a case in which the value of the frequency dividing ratio setting signals P'<0:4> is 16 to 31, the selection signal generating circuit 5a outputs the selection signal indicating that the clock signal "clk(5)" is to be selected to the multiplexer 5b.

In this first embodiment, an example in which the frequency dividing ratio is set to 12 is described, so that the selection signal generating circuit 5a outputs the selection signal indicating that the clock signal "clk(4)" is selected to the multiplexer 5b.

The multiplexer 5b of the edge detecting circuit 5 selects the clock signal "clk" indicated by the selection signal output from the selection signal generating circuit 5a out of the clock signals "clk(3)" to "clk(5)", and outputs the selected clock signal "clk" to the flip-flop 5c.

In this first embodiment, since the multiplexer 5b receives the selection signal indicating that the clock signal "clk(4)" is selected from the selection signal generating circuit 5a, the multiplexer 5b selects the clock signal "clk(4)" out of the clock signals "clk(3)" to "clk(5)" and outputs the clock signal "clk(4)" to the flip-flop 5c.

When the clock signal "clk(4)" output from the multiplexer 5b falls as illustrated in FIG. 4, the flip-flop 5c of the edge detecting circuit 5 outputs the clock signal "out" having the H level. When the frequency dividing ratio control signal "mod(1)" output from the MODout terminal of the dual modulus frequency divider 2-1 rises, the flip-flop 5c outputs the clock signal "out" having the L level.

As illustrated in FIG. 4, the clock signal "out" output from the flip-flop 5c is the signal obtained by frequency-dividing the clock signal "clk(1)" by 12 by the variable frequency divider in FIG. 1.

The clock signal "out" output from the flip-flop 5c is provided to the retiming circuit 4.

Next, in a case in which the frequency dividing ratio of the variable frequency divider is changed to 7, the frequency dividing ratio setting signals P<0:4> as described below are externally provided to the retiming circuit 4.

P<0>=1
P<1>=1
P<2>=1
P<3>=0
P<4>=0

The flip-flops 4-0 to 4-4 of the retiming circuit 4 hold the externally provided frequency dividing ratio setting signals P<0:4> and output the held frequency dividing ratio setting signals P<0:4> to the dual modulus frequency dividers 2-1, 2-2, 1-1, and 1-2 and the selection signal generating circuit 5a of the edge detecting circuit 5 as the frequency dividing ratio setting signals P'<0:4> at the timing at which the clock signal "out" output from the flip-flop 5c of the edge detecting circuit 5 rises.

Further, the flip-flops 4-2 to 4-4 output the held frequency dividing ratio setting signals P'<2:4> to the reset circuit 6 at the timing at which the clock signal "out" rises.

Note that, at the timing at which the clock signal "out" rises, all the signal levels of the clock signals "clk(1)" to "clk(5)" are simultaneously at the L level.

As a result, the frequency dividing ratio setting signal P'<0>=1 is provided to the P terminal of the dual modulus frequency divider 2-1, and the frequency dividing ratio setting signal P'<1>=1 is provided to the P terminal of the dual modulus frequency divider 2-2.

Further, the frequency dividing ratio setting signal P'<2>=1 is provided to the P terminal of the dual modulus frequency divider 1-1, and the frequency dividing ratio setting signal P'<3>=0 is provided to the P terminal of the dual modulus frequency divider 1-2.

Moreover, the frequency dividing ratio setting signal P'<4>=0 is provided to a RESET terminal of the dual modulus frequency divider 1-2.

Since the frequency dividing ratio setting signal P'<4>=0 is the significant reset signal, that is, the reset signal having the L level, the internal state of the dual modulus frequency divider 1-2 in the first frequency divider group 1 is initialized and the frequency dividing operation is invalidated as in the case in which the frequency dividing ratio is 12.

That is, in the high through latch 12 of the dual modulus frequency divider 1-2, when the reset signal having the L level is provided to the RESET terminal, the signal level of the frequency dividing ratio control signal "mod" output from the Q terminal is initialized to the L level. As a result, the frequency dividing ratio control signal "mod" having the L level is output from the MODout terminal of the dual modulus frequency divider 1-2 to the OR gate 6-3.

Further, in the low through latch 14 of the dual modulus frequency divider 1-2, when the reset signal having the L level is provided to the RESET terminal, the signal level of the signal output from the Q bar terminal is initialized to the H level.

In the high through latch 16 of the dual modulus frequency divider 1-2, when the reset signal having the L level is provided to the SET terminal, the signal level of the signal output from the Q terminal is initialized to the H level.

Further, in the low through latch 17 of the dual modulus frequency divider 1-2, when the reset signal having the L level is provided to the SET terminal, the signal level of the frequency divided signal of the clock signal "clk(4)" output from the Q bar terminal, that is, the clock signal "clk(5)" is initialized to the L level. In addition, the signal level of the signal output from the Q terminal is initialized to the H level.

Although the OR gate 6-3 receives the frequency dividing ratio control signal "mod" having the L level from the dual modulus frequency divider 1-2, since the OR gate 6-3 receives the frequency dividing ratio setting signal P'<4>=0 from the flip-flop 4-4, the OR gate 6-3 outputs the frequency dividing ratio control signal "mod(4)" having the H level to the dual modulus frequency divider 1-1 as illustrated in FIG. 4.

Since the OR gate 6-1 receives the frequency dividing ratio setting signal P'<3>=0 from the flip-flop 4-3 and receives the frequency dividing ratio setting signal P'<4>=0 from the flip-flop 4-4, the OR gate 6-1 outputs the signal having the L level to the OR gate 6-4 and the RESET terminal of the dual modulus frequency divider 1-1.

Since the signal having the L level output from the OR gate 6-1 is the significant reset signal, that is, the reset signal having the L level, the internal state of the dual modulus frequency divider 1-1 is initialized and the frequency dividing operation is invalidated as in the case of the dual modulus frequency divider 1-2.

That is, in the high through latch 12 of the dual modulus frequency divider 1-1, when the reset signal having the L level is provided to the RESET terminal, the signal level of the frequency dividing ratio control signal "mod" output from the Q terminal is initialized to the L level. As a result, the frequency dividing ratio control signal "mod" having the L level is output from the MODout terminal of the dual modulus frequency divider 1-1 to the OR gate 6-4.

Further, in the low through latch 14 of the dual modulus frequency divider 1-1, when the reset signal having the L level is provided to the RESET terminal, the signal level of the signal output from the Q bar terminal is initialized to the H level.

In the high through latch 16 of the dual modulus frequency divider 1-1, when the reset signal having the L level is provided to the SET terminal, the signal level of the signal output from the Q terminal is initialized to the H level.

Further, in the low through latch 17 of the dual modulus frequency divider 1-1, when the reset signal having the L level is provided to the SET terminal, the signal level of the frequency divided signal of the clock signal "clk(3)" output from the Q bar terminal, that is, the clock signal "clk(4)" is initialized to the L level. The signal level of the signal output from the Q terminal is initialized to the H level.

Although the OR gate 6-4 receives the frequency dividing ratio control signal "mod" having the L level from the dual modulus frequency divider 1-1, since the OR gate 6-4 receives the signal having the L level from the OR gate 6-1, the OR gate 6-4 outputs the frequency dividing ratio control signal "mod(3)" having the H level to the dual modulus frequency divider 2-2 as illustrated in FIG. 4.

Since the dual modulus frequency divider 2-2 in the second frequency divider group 2 receives the frequency dividing ratio control signal "mod(3)" having the H level from the OR gate 6-4, and receives the frequency dividing ratio setting signal P'<1>=1 from the flip-flop 4-1, the frequency dividing ratio is set to 3.

That is, since the frequency dividing ratio control signal "mod(3)" having the H level is input to the AND gate 21 of the dual modulus frequency divider 2-2, the inverted signal of the frequency divided signal output from the Q terminal of the low through latch 27 passes through the AND gate 21 and is output to the high through latch 22.

Further, since the frequency dividing ratio setting signal P'<1>=1 is input to the AND gate 23 of the dual modulus frequency divider 2-2, the signal output from the high through latch 22 passes through the AND gate 23 and is output to the low through latch 24 in synchronization with the clock signal "clk(2)" input from the input terminal IN.

Therefore, since the AND gate 21 and the high through latch 22 contribute to the frequency dividing operation together with the AND gate 23, the low through latch 24, the AND gate 25, the high through latch 26, and the low through latch 27, the frequency dividing ratio is set to 3.

As a result, as illustrated in FIG. 4, the dual modulus frequency divider 2-2 frequency-divides the clock signal "clk(2)" by 3 in synchronization with a falling edge of the clock signal "clk(2)" input from the input terminal IN and outputs the clock signal "clk(3)" which is the frequency divided signal of the clock signal "clk(2)" from the output terminal OUT to the dual modulus frequency divider 1-1 and the multiplexer 5b of the edge detecting circuit 5 on the subsequent stage.

Further, as illustrated in FIG. 4, the dual modulus frequency divider 2-2 frequency-divides the clock signal "clk(2)" input from the input terminal IN by 2 in synchronization with the rising edge of the clock signal "clk(2)" and outputs the signal obtained by frequency-dividing the clock signal "clk(2)" by 2 from the MODout terminal to the dual modulus frequency divider 2-1 as the frequency dividing ratio control signal "mod(2)".

That is, the AND gate 21 of the dual modulus frequency divider 2-2 outputs the signal having the H level to the high through latch 22 when the signal levels of the frequency dividing ratio control signal "mod(3)" input from the MODin terminal and the inverted signal of the frequency divided signal output from the low through latch 27 are the H levels, and outputs the signal having the L level to the high through latch 22 when the signal level of at least one of the frequency dividing ratio control signal "mod(3)" and the inverted signal is the L level.

In a state in which the signal level of the clock signal "clk(2)" input from the input terminal IN is the H level, when the high through latch 22 of the dual modulus frequency divider 2-2 receives the signal from the AND gate 21, the high through latch 22 outputs the signal from the Q terminal to the MODout terminal as the frequency dividing ratio control signal "mod(2)". In a case in which the signal level of the clock signal "clk(2)" is the L level, the high through latch 22 holds the signal level of the signal output from the Q terminal.

In the example in FIG. 4, the frequency dividing ratio control signal "mod(2)" having the H level is output in a period from the rising of the first clock signal "clk(2)" to the rising of the second clock signal "clk(2)" in the time started from the timing of "clk(3) falling" shown in FIG. 4.

Since the dual modulus frequency divider 2-1 in the second frequency divider group 2 receives the frequency dividing ratio setting signal P'<0>=1 from the flip-flop 4-0, the frequency dividing ratio is set to 3 in a period in which the signal level of the frequency dividing ratio control signal "mod(2)" output from the dual modulus frequency divider 2-2 is the H level.

In a period in which the signal level of the frequency dividing ratio control signal "mod(2)" output from the dual modulus frequency divider 2-2 is the L level, the frequency dividing ratio is set to 2.

That is, since the frequency dividing ratio setting signal P'<0>=1 is input to the AND gate 23 of the dual modulus frequency divider 2-2, in a period in which the frequency dividing ratio control signal "mod(2)" having the H level is input, the signal output from the high through latch 22 passes through the AND gate 23 and is output to the low through latch 24 in synchronization with the clock signal "clk(1)" input from the input terminal IN.

Therefore, since the AND gate 21 and the high through latch 22 contribute to the frequency dividing operation, the frequency dividing ratio is set to 3.

Further, in a period in which the frequency dividing ratio control signal "mod(2)" having the L level is input, the signal level of the output signal of the AND gate 23 is always the L level, so that the AND gate 21 and the high through latch 22 do not contribute to frequency dividing operation and the frequency dividing ratio is set to 2.

As a result, as illustrated in FIG. 4, the dual modulus frequency divider 2-1 frequency-divides the clock signal "clk(1)" input from the input terminal IN by 3 in a period in which the frequency dividing ratio control signal "mod(2)" having the H level is input. The dual modulus frequency divider 2-1 frequency-divides the clock signal "clk(1)" input from the input terminal IN by 2 in a period in which the frequency dividing ratio control signal "mod(2)" having the L level is input. The dual modulus frequency divider 2-1 outputs the clock signal "clk(2)" which is the frequency divided signal of the clock signal "clk(1)" from the output terminal OUT to the dual modulus frequency divider 2-2 on the subsequent stage.

Further, as illustrated in FIG. 4, the dual modulus frequency divider 2-1 frequency-divides the clock signal "clk(1)" by 2 in synchronization with the rising edge of the clock signal "clk(1)" input from the input terminal IN and outputs the signal obtained by frequency-dividing the clock signal "clk(1)" by 2 from the MODout terminal as the frequency dividing ratio control signal "mod(1)" to the flip-flop 5c of the edge detecting circuit 5.

That is, the AND gate 21 of the dual modulus frequency divider 2-1 outputs the signal having the H level to the high through latch 22 when the signal levels of the frequency dividing ratio control signal "mod(2)" input from the MODin terminal and the inverted signal of the frequency divided signal output from the low through latch 27 are the H levels, and outputs the signal having the L level to the high through latch 22 when the signal level of at least one of the frequency dividing ratio control signal "mod(2)" and the inverted signal is the L level.

In a state in which the signal level of the clock signal "clk(1)" input from the input terminal IN is the H level, when the high through latch 22 of the dual modulus frequency divider 2-1 receives a signal from the AND gate 21, the high through latch 22 outputs the signal from the Q terminal to the MODout terminal as the frequency dividing ratio control signal "mod(1)". In a case in which the signal level of the clock signal "clk(1)" is the L level, the high through latch 22 holds the signal level of the signal output from the Q terminal.

In the example in FIG. 4, the frequency dividing ratio control signal "mod(1)" having the H level is output in a period from the rising of the third clock signal "clk(1)" to the rising of the fourth clock signal "clk(1)" in the time started from the timing of "clk(3) falling" shown in FIG. 4.

The selection signal generating circuit 5a of the edge detecting circuit 5 determines the clock signal "clk" to be selected out of the clock signals "clk(3)" to "clk(5)" in accordance with the frequency dividing ratio setting signal P'<0:4> when receiving the frequency dividing ratio setting signal P'<0:4> from the retiming circuit 4 and outputs the selection signal indicating that the determined clock signal "clk" is selected to the multiplexer 5b.

That is, in a case in which the value of the frequency dividing ratio setting signals P'<0:4> output from the retiming circuit 4 is 4 to 7, the selection signal generating circuit 5a outputs the selection signal indicating that the clock signal "clk(3)" is selected to the multiplexer 5b. In a case in which the value of the frequency dividing ratio setting signals P'<0:4> is 8 to 15, the selection signal generating circuit 5a outputs the selection signal indicating that the clock signal "clk(4)" is selected to the multiplexer 5b. In a case in which the value of the frequency dividing ratio setting signals P'<0:4> is 16 to 31, the selection signal generating circuit 5a outputs the selection signal indicating that the clock signal "clk(5)" is selected to the multiplexer 5b.

At this stage, since the frequency dividing ratio is set to 7, the selection signal generating circuit 5a outputs the selection signal indicating that the clock signal "clk(3)" is selected to the multiplexer 5b.

The multiplexer 5b of the edge detecting circuit 5 selects the clock signal "clk" indicated by the selection signal output from the selection signal generating circuit 5a out of the clock signals "clk(3)" to "clk(5)", and outputs the selected clock signal "clk" to the flip-flop 5c.

Since the multiplexer 5b receives the selection signal indicating that the clock signal "clk(3)" is selected from the selection signal generating circuit 5a at this stage, the multiplexer 5b selects the clock signal "clk(3)" out of the clock signals "clk(3)" to "clk(5)" and outputs the clock signal "clk(3)" to the flip-flop 5c.

When the clock signal "clk(3)" output from the multiplexer 5b falls as illustrated in FIG. 4, the flip-flop 5c of the edge detecting circuit 5 outputs the clock signal "out" having the H level. When the frequency dividing ratio control signal "mod(1)" output from the MODout terminal of the dual modulus frequency divider 2-1 rises, the flip-flop 5c outputs the clock signal "out" having the L level.

As illustrated in FIG. 4, the clock signal "out" output from the flip-flop 5c is the signal obtained by frequency-dividing the clock signal "clk(1)" by 7 by the variable frequency divider in FIG. 1.

The clock signal "out" output from the flip-flop 5c is provided to the retiming circuit 4.

As is apparent from the above description, according to the first embodiment, the setting data output circuit updates the setting data in synchronization with the frequency divided signal output from a dual modulus frequency divider on a last stage out of the dual modulus frequency dividers to which the non-significant reset signal is output from the reset circuit and which are included in the plurality of dual modulus frequency dividers in the first frequency divider group. As a result, when the frequency dividing ratio of the dual modulus frequency divider in the last stage out of valid dual modulus frequency dividers contributing to the frequency dividing operation is 3, even in a case in which a frequency dividing ratio pattern, in which the number of the valid dual modulus frequency dividers contributing to the frequency dividing operation is decreased, is provided, it is possible to realize normal frequency dividing operation.

That is, according to the first embodiment, the internal state of the dual modulus frequency divider in which the frequency dividing operation is invalided is initialized when the frequency dividing ratio setting signals P'<0:4> are output from the flip-flops 4-0 to 4-4 of the retiming circuit 4. Thus, when the frequency dividing ratio of the dual modulus frequency divider on the last stage out of the valid dual modulus frequency dividers contributing to the frequency dividing operation is 3, it is possible to realize the normal frequency dividing operation even in a case in which a frequency dividing ratio pattern, in which the number of valid dual modulus frequency dividers contributing to the frequency dividing operation is decreased, is provided.

In this first embodiment, it is described that the normal frequency dividing operation can be realized even when the frequency dividing ratio of the variable frequency divider is changed from 12 to 7. However, this is merely an example, and in a case in which the frequency dividing ratio of the dual modulus frequency divider on the last stage out of the valid dual modulus frequency dividers contributing to the frequency dividing operation is 3, when a frequency dividing ratio pattern, in which the number of the valid dual modulus frequency dividers contributing to the frequency dividing operation is decreased, is provided, normal frequency dividing operation can be realized in any frequency dividing ratio pattern. Therefore, for example, even in a case in which the frequency dividing ratio of the variable frequency divider is changed from 14 to 7, or in a case in which the frequency dividing ratio of the variable frequency divider is changed from 12 to 5, it is possible to realize normal frequency dividing operation.

Second Embodiment

In the first embodiment described above, for example, considering the case in which the initialization of the internal state of the dual modulus frequency divider 1-1 is canceled, the delay time from the rising of the clock signal "out" output from the flip-flop 5c of the edge detecting circuit 5 to the falling of the frequency dividing ratio control signal "mod(3)" is the sum of the delay times of the flip-flops 4-2 to 4-4, the delay time of the OR gate 6-1, and the delay of the OR gate 6-3.

Therefore, in a case in which the number of dual modulus frequency dividers in the first frequency divider group 1 is N, for example, (N−2) OR gates are connected in series to the OR gate 6-1, so that under a worst condition, there is delay time of (N−1) OR gates. This delay time may become a limitation of the maximum operating frequency of the variable frequency divider.

Therefore, in a second embodiment, a variable frequency divider capable of shortening delay time and increasing the maximum operating frequency is described.

Figure 5:
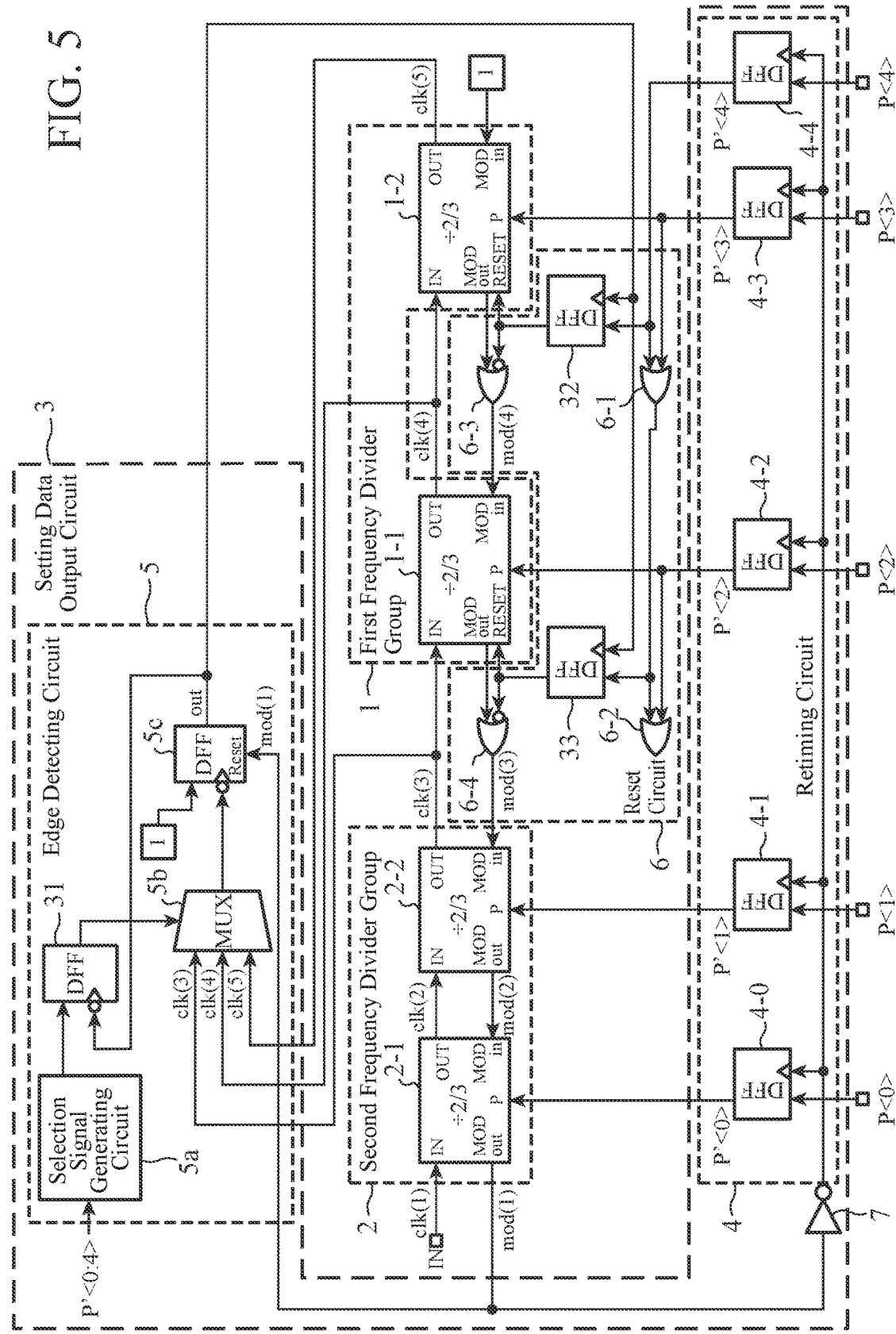
FIG. 5 is a configuration diagram illustrating a variable frequency divider according to a second embodiment of the present invention.

FIG. 5 is a configuration diagram illustrating a frequency divider according to the second embodiment of the present invention. In FIG. 5, the same reference signs as those in FIG. 1 represent the same or corresponding parts, so that the description thereof is omitted.

Flip-flops 4-0 to 4-4 of a retiming circuit 4 hold externally provided frequency dividing ratio setting signals P<0> to P<4> as in the above-described first embodiment. Further, in the second embodiment, the flip-flops 4-0 to 4-4 output the held frequency dividing ratio setting signals P<0> to P<4> as frequency dividing ratio setting signals P'<0> to P'<4> at the timing at which a frequency dividing ratio control signal "mod(1)", which is output from a dual modulus frequency divider 2-1 being the dual modulus frequency divided on a first stage among dual modulus frequency dividers 2-1, 2-2, 1-1, and 1-2, falls.

An inverter 7 inverts a signal level of the frequency dividing ratio control signal "mod(1)" output from the dual modulus frequency divider 2-1 and outputs the frequency dividing ratio control signal "mod(1)" whose signal level is inverted to the retiming circuit 4.

In the second embodiment, an edge detecting circuit 5 includes a flip-flop 31 in addition to a selection signal generating circuit 5a, a multiplexer 5b, and a flip-flop 5c.

The flip-flop 31 holds a selection signal output from the selection signal generating circuit 5a, and outputs the held selection signal to the multiplexer 5b at the timing at which a clock signal "out" output from the flip-flop 5c falls.

In the second embodiment, a reset circuit 6 includes flip-flops 32 and 33 in addition to OR gates 6-1 to 6-4.

The flip-flop 32 holds the frequency dividing ratio setting signal P'<4> output from the flip-flop 4-4 and outputs the held frequency dividing ratio setting signal P'<4> to the OR gate 6-3 and a RESET terminal of the dual modulus frequency divider 1-2 at the timing at which the clock signal "out" output from the flip-flop 5c of the edge detecting circuit 5 rises.

The flip-flop 33 holds the output signal of the OR gate 6-1, and outputs the held output signal of the OR gate 6-1 to the OR gate 6-4 and the RESET terminal of the dual modulus frequency divider 1-1 at the timing at which the clock signal "out" output from the flip-flop 5c of the edge detecting circuit 5 rises.

Next, operation will be described.

The configuration of the present invention is different from that of the first embodiment described before in that the flip-flops 31, 32, and 33 are added, and the signal input to the flip-flops 4-0 to 4-4 of the retiming circuit 4 is changed to the frequency dividing ratio control signal "mod(1)" output from the inverter 7 and whose signal level is inverted in place of the clock signal "out" output from the flip-flop 5c of the edge detecting circuit 5.

The flip-flop 31 of the edge detecting circuit 5 holds the selection signal output from the selection signal generating circuit 5a.

The flip-flop 31 outputs the held selection signal to the multiplexer 5b at the timing at which the clock signal "out" output from the edge detecting circuit 5 falls.

The flip-flops 4-0 to 4-4 of the retiming circuit 4 hold the externally provided frequency dividing ratio setting signals P<0> to P<4> as in the above-described first embodiment.

In the second embodiment, however, the flip-flops 4-0 to 4-4 output the held frequency dividing ratio setting signals P<0> to P<4> as the frequency dividing ratio setting signals P'<0> to P'<4> at the timing at which the frequency dividing ratio control signal "mod(1)" output from the dual modulus frequency divider 2-1 falls, that is, the timing at which the frequency dividing ratio control signal "mod(1)" after the signal level inversion output from the inverter 7 rises.

Since the timing at which the frequency dividing ratio control signal "mod(1)" output from the dual modulus frequency divider 2-1 falls is earlier than the timing at which the clock signal "out" rises, the timing at which the flip-flops 4-0 to 4-4 output the frequency dividing ratio setting signals P'<0> to P'<4> is earlier than that in the above-described first embodiment.

When the flip-flop 32 receives the frequency dividing ratio setting signal P'<4> from the flip-flop 4-4, the flip-flop 32 holds the frequency dividing ratio setting signal P'<4> and outputs the held frequency dividing ratio setting signal P'<4> to the OR gate 6-3 and a RESET terminal of the dual modulus frequency divider 1-2 at the timing at which the clock signal "out" output from the flip-flop 5c of the edge detecting circuit 5 rises.

The flip-flop 33 holds the output signal of the OR gate 6-1, and outputs the held output signal of the OR gate 6-1 to the OR gate 6-4 and the RESET terminal of the dual modulus frequency divider 1-1 at the timing at which the clock signal "out" output from the flip-flop 5c of the edge detecting circuit 5 rises.

As a result, the delay time from the rising of the clock signal "out" output from the flip-flop 5c of the edge detecting circuit 5 to the falling of a frequency dividing ratio control signal "mod(3)" is the sum of the delay times of the flip-flop 32 and the OR gate 6-3. Consequently, the delay time becomes shorter than the delay time in the first embodiment, so that the operating speed can be improved.

That is, the sum of the delay times of the flip-flop 32 and the OR gate 6-3 is shorter than the sum of the delay times of the flip-flops 4-2 to 4-4, the delay time of the OR gate 6-1, and the delay time of the OR gate 6-3, so that the operating speed can be improved comparing with the first embodiment.

In the present invention, embodiments may be freely combined, any component of each embodiment may be modified, or any component of each embodiment may be omitted without departing from the scope of the invention.

INDUSTRIAL APPLICABILITY

The present invention is suitable for a variable frequency divider capable of making the frequency dividing ratio variable.

REFERENCE SIGNS LIST

1: First frequency divider group, 1-1, 1-2: Dual modulus frequency divider, 2: Second frequency divider group, 2-1, 2-2: Dual modulus frequency divider, 3: Setting data output circuit, 4: Retiming circuit, 4-0 to 4-4: Flip-flop, 5: Edge detecting circuit, 5a: Selection signal generating circuit, 5b: Multiplexer, 5c: Flip-flop, 6: Reset circuit, 6-1 to 6-4: OR gate, 7: Inverter, 11: AND gate, 12: High through latch, 13: AND gate, 14: Low through latch, 15: AND gate, 16: High through latch, 17: Low through latch, 21: AND gate, 22: High through latch, 23: AND gate, 24: Low through latch, 25: AND gate, 26: High through latch, 27: Low through latch, 31, 32, 33: Flip-flop.

The invention claimed is:

1. A variable frequency divider comprising:

a first frequency divider group in which a plurality of dual modulus frequency dividers are connected in series, each of the dual modulus frequency dividers being such that an internal state is initialized in a state in which a significant reset signal is provided, and a frequency dividing ratio is set to a first frequency dividing ratio or a second frequency dividing ratio in accordance with setting data and an input signal is frequency-divided with the set frequency dividing ratio to be a frequency divided signal and the frequency divided signal of the input signal is output in a state in which a non-significant reset signal is provided;

a setting data output circuit outputting the setting data to the plurality of dual modulus frequency dividers in the first frequency divider group; and a reset circuit generating the significant reset signal or the non-significant reset signal in accordance with the setting data output from the setting data output circuit and outputting the significant reset signal or the non-significant reset signal to the plurality of dual modulus frequency dividers, wherein the setting data output circuit updates the setting data in synchronization with the frequency divided signal output from a dual modulus frequency divider on a last stage out of the dual modulus frequency dividers to which the non-significant reset signal is output from the reset circuit and which are included in the plurality of dual modulus frequency dividers in the first frequency divider group, wherein a second frequency divider group is connected in series to a preceding stage of the first frequency divider group, the second frequency divider group being formed such that a plurality of dual modulus frequency dividers are connected in series, wherein in each of the plurality of dual modulus frequency dividers in the second frequency divider group, a frequency dividing ratio is set to a first frequency dividing ratio or a second frequency dividing ratio in accordance with the setting data output from the setting data output circuit, an input signal is frequency-divided with the set frequency dividing ratio, and a frequency divided signal of the input signal is output, and wherein, in each of the plurality of dual modulus frequency dividers in the first frequency divider group and the second frequency divider group, the frequency dividing ratio is set to the first frequency dividing ratio in a case in which a first control signal indicating that the frequency dividing ratio is fixed is provided, and the frequency dividing ratio is set to the first frequency dividing ratio or the second frequency dividing ratio in accordance with the setting data output from the setting data output circuit in a case in which a second control signal indicating that the frequency dividing ratio is allowed to be variable is provided.

2. The variable frequency divider according to claim 1, wherein the setting data output circuit updates the setting data in synchronization with the frequency divided signal output from a dual modulus frequency divider on a last stage out of the plurality of dual modulus frequency dividers in the second frequency divider group in a case in which the significant reset signal is output from the reset circuit to all of the plurality of dual modulus frequency dividers in the first frequency divider group.

3. The variable frequency divider according to claim 1, wherein each of the plurality of dual modulus frequency dividers in the first frequency divider group outputs the first control signal or the second control signal in accordance with a control signal provided from a dual modulus frequency divider on a subsequent stage of the own dual modulus frequency divider or from outside and an input signal in a case in which the non-significant reset signal is output from the reset circuit, and the reset circuit outputs the second control signal to the dual modulus frequency divider on the preceding stage of a dual modulus frequency divider to which the significant reset signal is output out of the plurality of dual modulus frequency dividers in the first frequency divider group, and outputs the first control signal or the second control signal, which is output from a dual modulus frequency divider to which the non-significant reset signal is output to be unchanged, to a dual modulus frequency divider on the preceding stage of a dual modulus frequency divider to which the non-significant reset signal is output.

4. The variable frequency divider according to claim 1, wherein each of a plurality of dual modulus frequency dividers in the second frequency divider group outputs the first control signal or the second control signal to a dual modulus frequency divider on a preceding stage of the own dual modulus frequency divider in accordance with a control signal output from a dual modulus frequency divider on a subsequent stage of the own dual modulus frequency divider and an input signal.

5. The variable frequency divider according to claim 1,
wherein the setting data output circuit updates the setting data in synchronization with the first control signal or the second control signal output from a dual modulus frequency divider on a first stage out of the plurality of dual modulus frequency dividers in the second frequency divider group in place of a frequency divided signal output from the dual modulus frequency divider on the last stage, and the reset circuit outputs the significant reset signal or the non-significant reset signal to the plurality of dual modulus frequency dividers in the first frequency divider group in synchronization with a frequency divided signal output from a dual modulus frequency divider on the last stage out of dual modulus frequency dividers to which the non-significant reset signal is output from the reset circuit which are included in a plurality of dual modulus frequency dividers in the first frequency divider group.

* * * * *